(12) United States Patent
Ando

(10) Patent No.: US 6,320,210 B1
(45) Date of Patent: Nov. 20, 2001

(54) HETERO-JUNCTION FIELD EFFECT TRANSISTOR

(75) Inventor: Yuji Ando, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/318,735

(22) Filed: May 26, 1999

(30) Foreign Application Priority Data

May 28, 1998 (JP) .................................................. 10-147927

(51) Int. Cl.$^7$ ....................... H01L 31/072; H01L 31/109; H01L 31/0328; H01L 31/0336
(52) U.S. Cl. .......................... 257/192; 257/194; 257/195; 438/167; 438/604
(58) Field of Search .................................... 257/792, 194, 257/195; 438/604, 167

(56) References Cited

U.S. PATENT DOCUMENTS

| | | | |
|---|---|---|---|
| 5,408,111 | * | 4/1995 | Nakajima et al. .................... 257/192 |
| 5,949,095 | * | 9/1999 | Nagahara et al. .................... 257/192 |

FOREIGN PATENT DOCUMENTS

| | | |
|---|---|---|
| 61-270874 | 12/1986 | (JP) . |
| 4-24128 | 8/1992 | (JP) . |
| 5-47740 | 2/1993 | (JP) . |
| 5-102197 | 4/1993 | (JP) . |
| 5-326562 | 12/1993 | (JP) . |
| 6-84960 | 3/1994 | (JP) . |
| 8-236753 | 9/1996 | (JP) . |

OTHER PUBLICATIONS

Japanese Office Action dated Aug. 15, 2000, with partial translation.

* cited by examiner

Primary Examiner—William Mintel
(74) Attorney, Agent, or Firm—McGinn & Gibb, PLLC

(57) ABSTRACT

There is provided a hetero-junction field effect transistor including (a) a first semiconductor layer composed of InP, (b) a second semiconductor layer formed on the first semiconductor layer, the second semiconductor layer having a smaller electron affinity than that of the first semiconductor layer, (c) a third semiconductor layer formed on the second semiconductor layer, the third semiconductor layer having a greater electron affinity than that of the second semiconductor layer, and being formed at a surface thereof with an opening, the third semiconductor layer being composed of InP, (d) source and drain electrodes formed on the third semiconductor layer, and (e) a gate electrode formed on the second semiconductor layer in the opening of the third semiconductor layer. In accordance with the hetero-junction field effect transistor, it is possible to enhance noise characteristic and high power characteristic.

16 Claims, 3 Drawing Sheets

HETERO-JUNCTION FIELD EFFECT TRANSISTOR

BACKGROUND OF THE INVENTION

1. Field of the Invention

The invention relates to a hetero-junction field effect transistor.

2. Description of the Related Art

FIG. 1 illustrates an example of a conventional hetero-junction field effect transistor (HJFET). The illustrated hetero-junction field effect transistor 100 is comprised of a semi-insulating InP substrate 110, an undoped InP buffer layer 120 junctioned on the semi-insulating InP substrate 110, an n-type InP channel layer 130 junctioned on the undoped InP buffer layer 120, an undoped InAlAs gate insulating layer 140 junctioned on the n-type InP channel layer 130, and an n-type InGaAs cap layer 150 junctioned on the undoped InAlAs gate insulating layer 140.

A source electrode 160 and a drain electrode 170 are formed on the n-type InGaAs cap layer 150 in ohmic contact.

The n-type InGaAs cap layer 150 is formed with an opening, and a gate electrode 180 is formed on the undoped InAlAs gate insulating layer 140 in the opening of the n-type InGaAs cap layer 150 in Schottky contact.

In an operation, if a current is made to run through the gate electrode 180, a current runs from the source electrode 160 to the drain electrode 170.

There have been suggested various hetero junction field effect transistors so far.

For instance, Japanese Unexamined Patent Publication No. 4-241428 has suggested a field effect transistor comprising an InP semiconductor substrate, a first undoped semiconductor layer formed on the InP semiconductor substrate, an n-type heavily doped InP channel layer formed on the first undoped semiconductor layer and having crystal structure which almost matches in lattice to the first undoped semiconductor layer, a second undoped InP semiconductor layer formed on the InP channel layer and having superior electron-transfer characteristic, a third undoped $Al_xIn_{1-x}As$ ($0.4 \leq X \leq 0.6$) semiconductor layer formed on the second undoped InP semiconductor layer, source and drain electrode formed on the third semiconductor layer, and a gate electrode formed on the second undoped InP semiconductor layer in an opening formed throughout the third semiconductor layer.

Japanese Unexamined Patent Publication No. 5-102197 has suggested a field effect transistor comprising a semi-insulating InP semiconductor substrate, a buffer layer formed on the substrate, an InP channel layer formed on the buffer layer, an $In_YGa_{1-Y}As$ ($0.45 \leq Y \leq 0.65$) spacer layer formed on the InP channel layer, an electron-donating layer formed on the spacer layer and composed of $Al_xIn_{1-x}As$ ($0.4 \leq X \leq 0.6$), a contact layer formed on the electron-donating layer, source and drain electrodes formed on the contact layer, and a gate electrode formed on the electron-donating layer in an opening formed throughout the contact layer. The spacer layer is designed to have such a thickness that secondary electron gas is formed in the channel layer due to electrons supplied from the electron-donating layer 5.

Japanese Unexamined Patent Publication No. 6-84960 has suggested a hetero-junction field effect transistor comprising a semi-insulating InP substrate, a first i-$In_{0.52}Al_{0.48}As$ layer, an i-InP layer, an i-$In_xGa_{1-x}As$ layer, an i-InP layer, a second i-$In_{0.52}Al_{0.48}As$ layer, an n-$In_{0.52}Al_{0.48}As$ layer, a third i-$In_{0.52}Al_{0.48}As$ layer, and an n-$In_{0.53}Al_{0.47}As$ layer, source and drain electrodes formed on the n-$In_{0.53}Al_{0.47}As$ layer in ohmic contact, and a gate electrode formed on third i-$In_{0.52}Al_{0.48}As$ layer in an opening formed throughout the n-$In_{0.53}Al_{0.47}As$ layer. The layers are formed on the semi-insulating InP substrate in this order.

The above-mentioned conventional hetero-junction field effect transistors are accompanied with the following problem.

For instance, in the conventional hetero-junction field effect transistor illustrated in FIG. 1, the cap layer 150 is composed of InGaAs. Hence, as illustrated in FIG. 2, a conduction band offset at an interface between the cap layer 150 and the gate insulating layer 140, which is equal to about 0.51 eV, is greater than a conduction band offset between the channel layer 130 and the gate insulating layer 140, which is equal to about 0.28 eV. This results in that an electron barrier is raised, and if the cap layer 150 is designed to make ohmic contact with the channel layer 130 through a non-alloy layer, a contact resistance therebetween would be increased.

Hence, source and drain resistances are also increased, resulting in reduction in power gain, increase in noise figure, and reduction in power addition efficiency to be obtained when a hetero-junction field effect transistor is operated with high-level signals.

SUMMARY OF THE INVENTION

In view of the above-mentioned problem in the conventional hetero-junction field effect transistors, it is an object of the present invention to provide a hetero-junction field effect transistor capable of reducing source and drain resistances to thereby enhance noise characteristic and high power characteristic.

There is provided a hetero-junction field effect transistor including (a) a first semiconductor layer composed of InP, (b) a second semiconductor layer formed on the first semiconductor layer, the second semiconductor layer having a smaller electron affinity than that of the first semiconductor layer, (c) a third semiconductor layer formed on the second semiconductor layer, the third semiconductor layer having a greater electron affinity than that of the second semiconductor layer, and being formed at a surface thereof with an opening, the third semiconductor layer being composed of InP, (d) source and drain electrodes formed on the third semiconductor layer, and (e) a gate electrode formed on the second semiconductor layer in the opening of the third semiconductor layer.

When a current is supplied to the gate electrode formed on the second semiconductor layer, a current runs from the source electrode to the drain electrode both formed on the third semiconductor layer. At this time, an electron barrier is lowered in the first and third semiconductor layers both composed of InP, resulting in reduction in source and drain resistances.

It is preferable that the first semiconductor layer is comprised of an n-type semiconductor layer.

By designing the first semiconductor layer to be comprised of an n-type semiconductor layer, it would be possible to reduce contact resistance between the first semiconductor layer and adjacent layers.

The first semiconductor layer may be comprised of a single n-type semiconductor layer or a plurality of n-type semiconductor layers.

By designing the first semiconductor layer to be comprised of a plurality of n-type semiconductor layers, it would be possible to further reduce contact resistance between the first semiconductor layer and adjacent layers.

It is preferable that the second semiconductor layer is composed of InAlAs.

By designing the second semiconductor layer to be composed of InAlAs, it would be possible to enhance electron mobility.

It is preferable that the second semiconductor layer is comprised of an n-type semiconductor layer.

By designing the second semiconductor layer to be comprised of an n-type semiconductor layer, it would be possible to reduce contact resistance between the second semiconductor layer and adjacent layers.

The second semiconductor layer may be comprised of a single n-type semiconductor layer or a plurality of n-type semiconductor layers.

By designing the second semiconductor layer to be comprised of a plurality of n-type semiconductor layers, it would be possible to further reduce contact resistance between the second semiconductor layer and adjacent layers.

It is preferable for the hetero-junction field effect transistor to further include a fourth semiconductor layer sandwiched between the second and third semiconductor layers, the fourth semiconductor layer being composed of InAlGaAs, in which case, it is preferable that the fourth semiconductor layer is composed of $In_{0.52}Al_XGa_{0.48-X}As$, and that a composition ratio X of Al is gradually decreasing from the second semiconductor layer to the third semiconductor layer.

For instance, the composition ratio X of Al may be decreased from 0.48 to 0.24.

It is preferable for the hetero-junction field effect transistor to further include a fifth semiconductor layer sandwiched between the third semiconductor layer and the source and drain electrodes, the fifth semiconductor layer being composed of n-type InGaAs, in which case, it is preferable that the fifth semiconductor layer is composed of n-type $In_YGa_{1-Y}As$ ($0.53 \leq Y \leq 1$).

It is preferable for the hetero-junction field effect transistor to further include a sixth semiconductor layer sandwiched between third and fifth semiconductor layers, the sixth semiconductor layer being composed of InAlGaAs.

For instance, a composition ratio of Al in the sixth semiconductor layer may be designed to gradually decrease from the third semiconductor layer to the sixth semiconductor layer.

It is preferable for the hetero-junction field effect transistor to further include a seventh semiconductor layer sandwiched between the first and second semiconductor layers, the seventh semiconductor layer being composed of undoped InAlAs.

It is preferable that the second semiconductor layer is formed with a recess in alignment with the opening of the third semiconductor layer, and that the gate electrode is formed on the second semiconductor layer in the recess.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

First Embodiment

Figure 1:
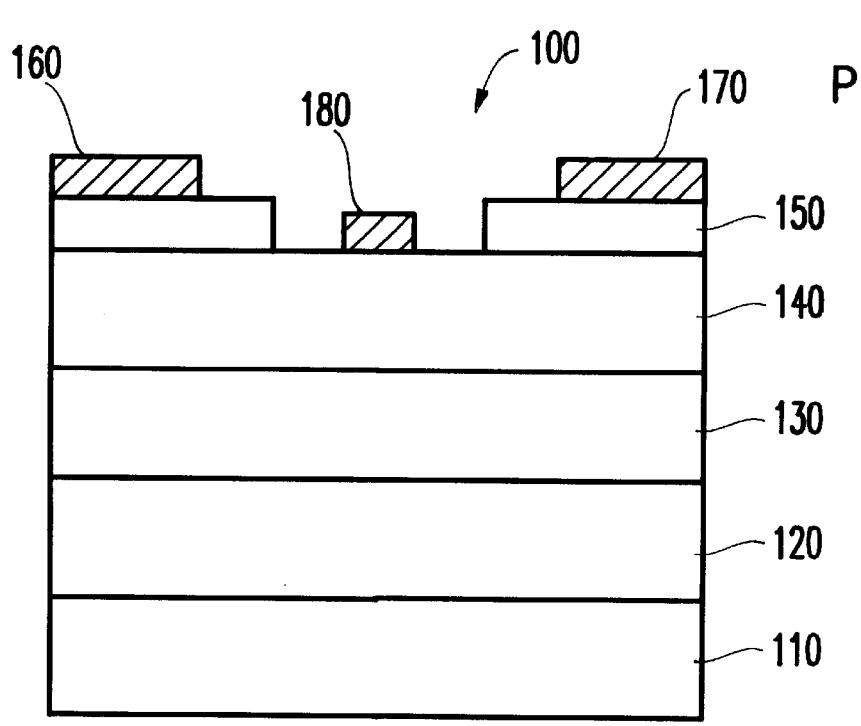
FIG. 1 is a cross-sectional view of a conventional hereto-junction field effect transistor.
Figure 2:
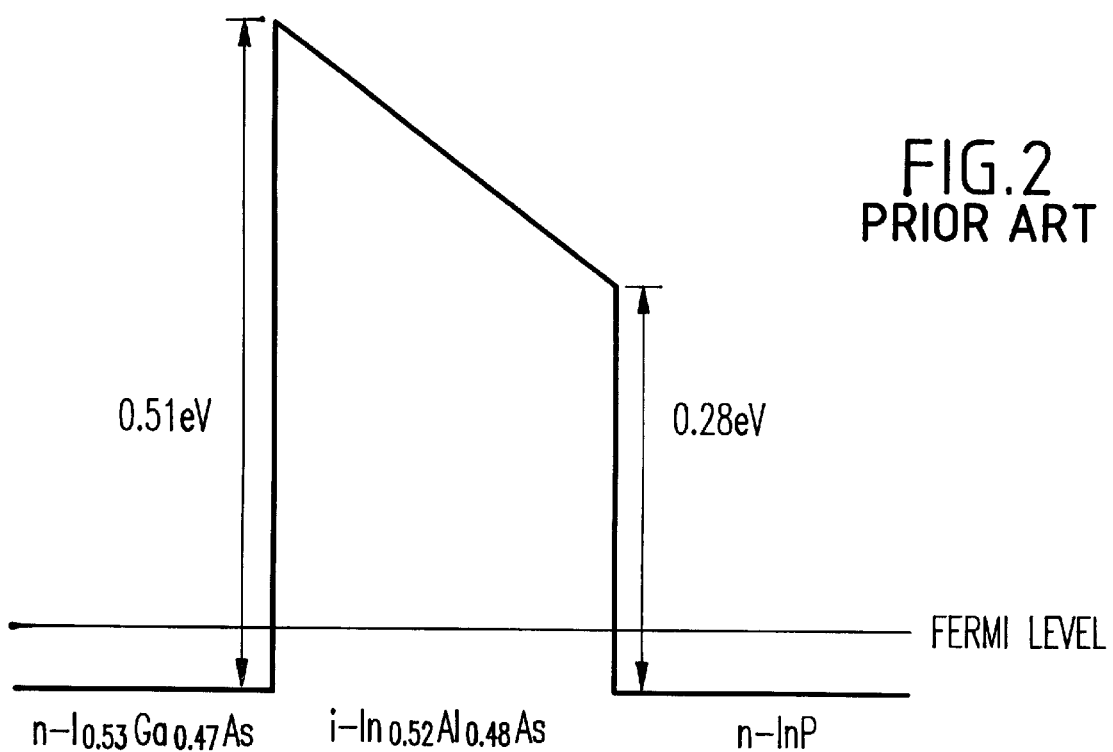
FIG. 2 illustrates conduction band energy in the conventional hereto-junction field effect transistor illustrated in FIG. 1.
Figure 3:
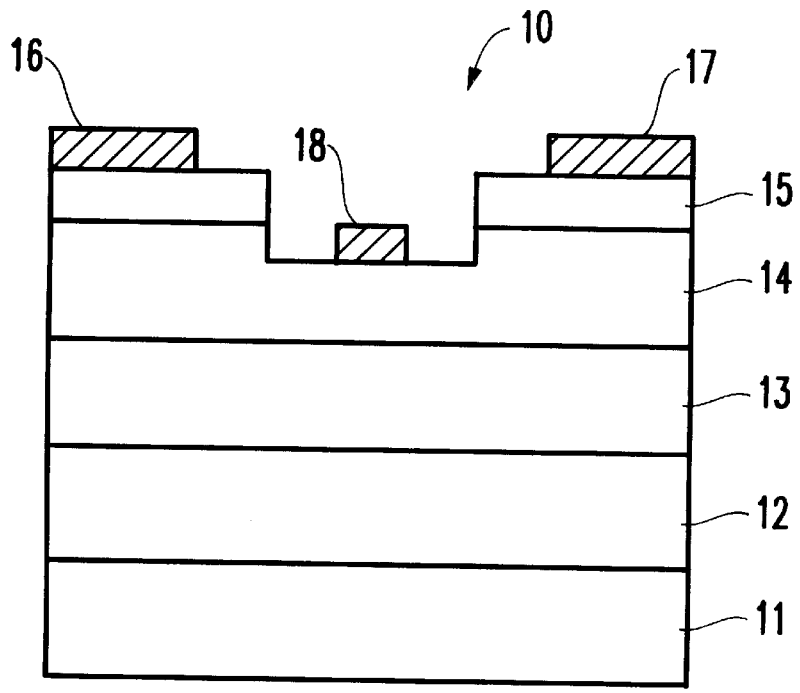
FIG. 3 is a cross-sectional view of a hereto-junction field effect transistor in accordance with the first embodiment of the present invention.

FIG. 3 is a cross-sectional view of a hetero-junction field effect transistor in accordance with the first embodiment.

The illustrated hetero-junction field effect transistor 10 is comprised of a semi-insulating InP substrate 11, an undoped InP buffer layer 12 junctioned on the semi-insulating InP substrate 11, an n-type InP channel layer 13 as the first semiconductor layer, junctioned on the undoped InP buffer layer 12, an undoped $In_{0.52}Al_{0.48}As$ gate insulating layer 14 as the second semiconductor layer, junctioned on the n-type InP channel layer 13, and an n-type InP cap layer 15 as the third semiconductor layer, junctioned on the undoped $In_{0.52}Al_{0.48}As$ gate insulating layer 14.

A source electrode 16 and a drain electrode 17 are formed on the n-type InP cap layer 15 in ohmic contact.

The n-type InP cap layer 15 is formed with an opening, and a gate electrode 18 is formed on the undoped $In_{0.52}Al_{0.48}As$ gate insulating layer 14 in the opening of the n-type InP cap layer 15 in Schottky contact.

In an operation, if a current is made to run through the gate electrode 18, a current runs from the source electrode 16 to the drain electrode 17.

The hetero-junction field effect transistor 10 is formed as follows.

First, the layers 12, 13, 14 and 15 are formed on the semi-insulating InP substrate 11 by organometallic vapor phase epitaxy (OMVPE).

Then, the thus formed epitaxial layer structure is etched to such a degree that the undoped InP buffer layer 12 appears, to thereby form a mesa for separating transistors from each other.

Then, an alloy such as AuGe/Ni/Au is deposited on the n-type InP cap layer 15 by evaporation. The alloy is then is patterned into the source electrode 16 and the drain electrode 17. The thus formed source and drain electrodes 16 and 17 make ohmic contact with the n-type InP cap layer 15.

Then, the n-type InP cap layer 15 is partially etched to thereby form an opening to thereby make the undoped $In_{0.52}Al_{0.48}As$ gate insulating layer 14 exposed. An alloy such as Ti/Pt/Au is deposited on the exposed $In_{0.52}Al_{0.48}As$ gate insulating layer 14 by evaporation, and then, is patterned into the gate electrode 18. The thus formed gate electrode 18 makes Schottky contact with the undoped $In_{0.52}Al_{0.48}As$ gate insulating layer 14.

In the first embodiment, the undoped InP buffer layer 12, the n-type InP channel layer 13, the undoped $In_{0.52}Al_{0.48}As$ gate insulating layer 14, and the n-type InP cap layer 15 are designed to have a thickness of 250 nm, 20 nm, 50 nm and 40 nm, respectively. The n-type InP channel layer 13 is designed to have an impurity concentration of $2\times10^{18}/cm^3$, and the n-type InP cap layer 15 is designed to have an impurity concentration of $5\times10^{18}/cm^3$.

Figure 4:
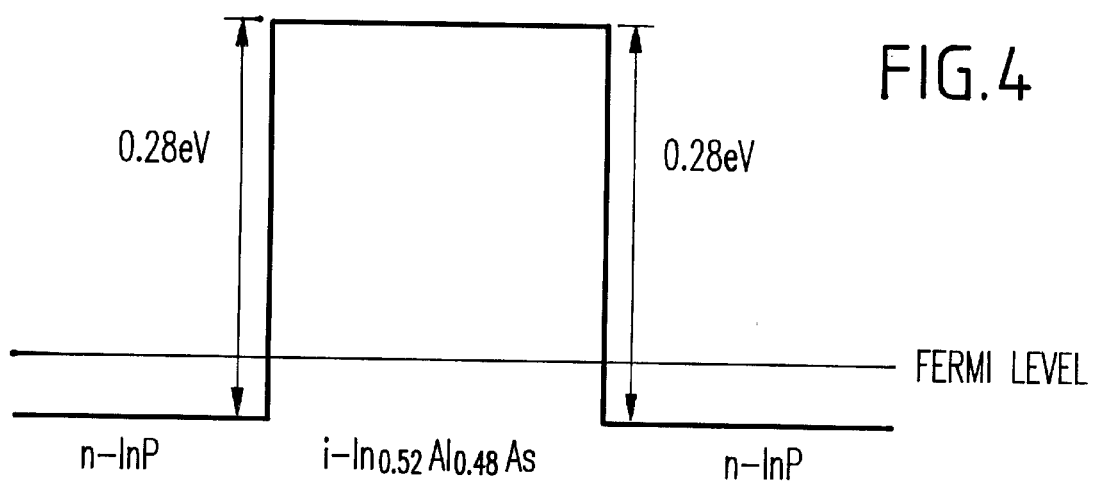
FIG. 4 illustrates conduction band energy in the hereto-junction field effect transistor illustrated in FIG. 3.

FIG. 4 illustrates conduction band energy obtained between the n-type InP cap layer 15 and the n-type InP channel layer 13 in the hetero-junction field effect transistor 10.

In the hereto-junction field effect transistor 10, since the cap layer 15 is composed of InP, as illustrated in FIG. 4, conduction band offset at an interface between the cap layer 15 and the gate insulating layer 14 is equal to conduction band offset at an interface between the channel layer 13 and the gate insulating layer 14. Specifically, both of the conduction band offsets 5 are equal to 0.28 eV.

Hence, it is possible to lower an electron barrier relative to a conventional hetero-junction field effect transistor including a cap layer composed of InGaAs, resulting in reduction in contact resistance between the cap layer 15 and the channel layer 13, and further resulting in reduction in source and drain resistances.

An InAlGaAs layer as the fourth layer may be interposed between the undoped InAlAs gate insulating layer 14 and the n-type InP cap layer 16.

For instance, the fourth layer may be designed to be composed of $In_{0.52}Al_XGa_{0.48-X}As$, in which case, a composition ratio X of Al is gradually decreasing from the undoped InAlAs gate insulating layer 14 to the n-type InP cap layer 15. For instance, the composition ratio X of Al is gradually decreased from 0.48 to 0.24.

As a result, conduction band energy is smoothly continuous from the undoped InAlAs gate insulating layer 14 to the n-type InP cap layer 15, ensuring reduction in contact resistance.

An n-type $In_YGa_{1-Y}As$ ($0.53 \leq Y \leq 1$) layer as the fifth semiconductor layer may be interposed between the n-type InP cap layer 15 and each of the source and drain electrodes 16 and 17.

Since contact resistivity between n-type InGaAs and metal of which the source and drain electrodes 16 and 17 are composed is relatively low, it is possible to further reduce source and drain resistances.

An InAlGaAs layer as the sixth semiconductor layer may be interposed between the n-type $In_YGa_{1-Y}As$ ($0.53 \leq Y \leq 1$) layer as the fifth semiconductor and the n-type InP cap layer 15. A composition ratio of Al in the InAlGaAs layer may designed to gradually decrease from the n-type InP cap layer 15 to the n-type InGaAs layer. By designing a composition ratio to be graded in the InAlGaAs layer, conduction band energy is smoothly continuous from the n-type InP cap layer 15 to the n-type InGaAs layer, ensuring reduction in contact resistance.

In accordance with the hetero-junction field effect transistor 10, it is possible to enhance noise characteristic and high power characteristic.

Second Embodiment

Figure 5:
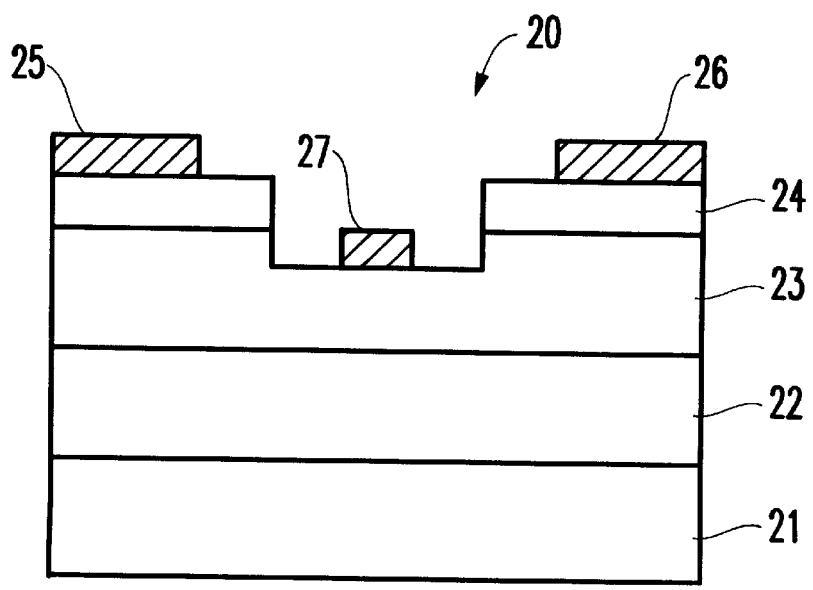
FIG. 5 is a cross-sectional view of a hereto-junction field effect transistor in accordance with the second embodiment of the present invention.

FIG. 5 is a cross-sectional view of a hetero-junction field effect transistor in accordance with the second embodiment.

The illustrated hetero-junction field effect transistor 20 is comprised of a semi-insulating InP substrate 21, an undoped InP buffer layer 22 as the first semiconductor layer, junctioned on the semi-insulating InP substrate 21, an n-type $In_{0.52}Al_{0.48}As$ electron-donating layer 23 as the second semiconductor layer, junctioned on the undoped InP buffer layer 22, and an n-type InP cap layer 24 as the third semiconductor layer, junctioned on the n-type $In_{0.52}Al_{0.48}As$ electron-donating layer 23.

There is generated secondary electron gas in the vicinity of an interface between the undoped InP buffer layer 22 and the n-type InAlAs electron-donating layer 23. The secondary electron gas forms a channel layer.

A source electrode 25 and a drain electrode 26 are formed on the n-type InP cap layer 24 in ohmic contact.

The n-type InP cap layer 24 is formed with an opening, and the n-type InAlAs electron-donating layer 23 is formed with a recess in alignment with the opening of the cap layer 24. A gate electrode 27 is formed on the n-type InAlAs electron-donating layer 23 in the recess in Schottky contact.

In an operation, if a current is made to run through the gate electrode 27, a current runs from the source electrode 25 to the drain electrode 26.

Figure 6:
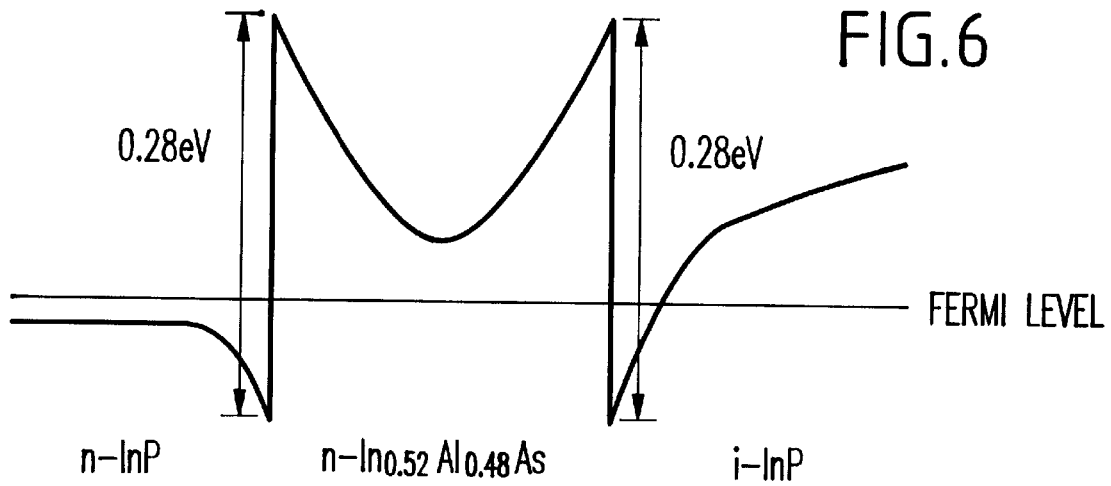
FIG. 6 illustrates conduction band energy in the hereto-junction field effect transistor illustrated in FIG. 5.

FIG. 6 illustrates conduction band energy obtained between the n-type InP cap layer 24 and the undoped InP buffer layer 22 in the hetero-junction field effect transistor 20.

In the hereto-junction field effect transistor 20, since the cap layer 24 is composed of InP, as illustrated in FIG. 6, conduction band offset at an interface between the cap layer 24 and the electron-donating layer 23 is equal to conduction band offset at an interface between the buffer layer 22 and the electron-donating layer 23. Specifically, both of the conduction band offset are equal to 0.28 eV.

Hence, it is possible to lower an electron barrier relative to a conventional hetero-junction field effect transistor including a cap layer composed of InGaAs, resulting in reduction in contact resistance between the cap layer 24 and the buffer layer 22.

In addition, since impurities contained in the n-type InAlAs electron-donating layer 23 are ionized to thereby bend the conduction band, an effective electron barrier is made thinner, resulting in reduction in contact resistance, and further reduction in source and drain resistances.

An undoped InAlAs spacer layer as the seventh layer may be interposed between the n-type InAlAs electron-donating layer 23 and the undoped InP buffer layer 22.

Formation of the undoped InAlAs spacer layer enhances mobility of secondary electrons generated in the n-type InP cap layer 24, enabling the hetero-junction field effect transistor 20 to operate at higher speed.

An InAlGaAs layer as the fourth semiconductor layer may be interposed between the n-type InAlAs electron-donating layer 23 and the n-type InP cap layer 24.

For instance, the InAlGaAs layer may be designed to have a composition of $In_{0.52}Al_XGa_{0.48-X}As$, in which case, a composition ratio X of Al is gradually decreasing from the n-type InAlAs electron-donating layer 23 to the n-type InP cap layer 24. For instance, the composition ratio X of Al is gradually decreased from 0.48 to 0.24.

As a result, conduction band energy is smoothly continuous from the n-type InAlAs electron-donating layer 23 to the n-type InP cap layer 24, ensuring reduction in contact resistance.

An n-type $In_YGa_{1-Y}As$ ($0.53 \leq Y \leq 1$) layer as the fifth semiconductor layer may be interposed between the n-type InP cap layer 24 and each of the source and drain electrodes 25 and 26.

Since contact resistivity between n-type InGaAs and metal of which the source and drain electrodes 25 and 26 are composed is relatively low, it is possible to further reduce source and drain resistances.

An InAlGaAs layer as the sixth semiconductor layer may be interposed between the n-type $In_YGa_{1-Y}As$ ($0.53 \leq Y \leq 1$) layer as the fifth semiconductor and the n-type InP cap layer 24. A composition ratio of Al in the InAlGaAs layer may be designed to gradually decrease from the n-type InP cap layer 24 to the n-type InGaAs layer. By designing a composition ratio to be graded in the InAlGaAs layer, conduction band energy is smoothly continuous from the n-type InP cap layer 24 to the n-type InGaAs layer, ensuring reduction in contact resistance.

In accordance with the hetero-junction field effect transistor 20, it is possible to enhance noise characteristic and high power characteristic.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 10-147927 filed on May 28, 1998 including specification, claims, drawings and summary is incorporated herein by reference in its entirety.

What is claimed is:

1. A hetero-junction field effect transistor comprising:
   (a) a first semiconductor layer composed of InP;
   (b) a second semiconductor layer formed on and contiguous to said first semiconductor layer, said second semiconductor layer having a smaller electron affinity than that of said first semiconductor layer;
   (c) a third semiconductor layer formed on and contiguous to said second semiconductor layer, said third semiconductor layer having a greater electron affinity than that of said second semiconductor layer, and being formed at a surface thereof with an opening, said third semiconductor layer being composed of InP;
   (d) source and drain electrode formed on said third semiconductor layer; and
   (e) a gate electrode formed on said second semiconductor layer in said opening of said third semiconductor layer.

2. A hetero-junction field effect transistor comprising:
   (a) a first semiconductor layer composed of InP;
   (b) a second semiconductor layer formed on said first semiconductor layer, said second semiconductor layer having a smaller electron affinity than that of said first semiconductor layer;
   (c) a third semiconductor layer formed on said second semiconductor layer, said third semiconductor layer having a greater electron affinity than that of said second semiconductor layer, and being formed at a surface thereof with an opening, said third semiconductor layer being) composed of InP;
   (d) source and drain electrodes formed on said third semiconductor layer; and
   (e) a gate electrode formed on said second semiconductor layer in said opening of said third semiconductor layer, wherein said first semiconductor layer is comprised of an n-type semiconductor layer.

3. The hetero-junction field effect transistor as set forth in claim 2, wherein said first semiconductor layer is comprised of a plurality of n-type semiconductor layers.

4. A hetero-junction field effect transistor comprising:
   (a) a first semiconductor layer composed of InP;
   (b) a second semiconductor layer formed on and contiguous to said first semiconductor layer, said second semiconductor layer having a smaller electron affinity than that of said first semiconductor layer;
   (c) a third semiconductor layer formed on said second semiconductor layer, said third semiconductor layer having a greater electron affinity than that of said second semiconductor layer, and being formed at a surface thereof with an opening, said third semiconductor layer being composed of InP;
   (d) source and drain electrode formed on said third semiconductor layer; and
   (e) a gate electrode formed on said second semiconductor layer in said opening of said third semiconductor layer, wherein said second semiconductor layer is composed of InAlAs.

5. A hetero-junction field effect transistor comprising:
   (a) a first semiconductor layer composed of InP;
   (b) a second semiconductor layer formed on and contiguous to said first semiconductor layer, said second semiconductor layer having a smaller electron affinity than that of said first semiconductor layer;
   (c) a third semiconductor layer formed on said second semiconductor layer, said third semiconductor layer having a greater electron affinity than that of said second semiconductor layer, and being formed at a surface thereof with an opening, said third semiconductor layer being composed of InP;
   (d) source and drain electrode formed on said third semiconductor layer; and
   (e) a gate electrode formed on said second semiconductor layer in said opening of said third semiconductor layer, wherein said second semiconductor layer is comprised of an n-type InAlAs semiconductor layer.

6. A hetero-junction field effect transistor comprising:
   (a) a first semiconductor layer composed of InP;
   (b) a second semiconductor layer formed on said first semiconductor layer, said second semiconductor layer having a smaller electron affinity than that of said first semiconductor layer;
   (c) a third semiconductor layer formed on said second semiconductor layer, said third semiconductor layer having a greater electron affinity than that of said second semiconductor layer, and being formed at a surface thereof with an opening, said third semiconductor layer being composed of InP;
   (d) source and drain electrode formed on said third semiconductor layer; and
   (e) a gate electrode formed on said second semiconductor layer in said opening of said third semiconductor layer, wherein said second semiconductor layer is comprised of a plurality of n-type semiconductor layers.

7. A hetero-junction field effect transistor comprising:
   (a) a first semiconductor layer composed of InP;
   (b) a second semiconductor layer formed on said first semiconductor layer, said second semiconductor layer having a smaller electron affinity than that of said first semiconductor layer;
   (c) a third semiconductor layer formed on said second semiconductor layer, said third semiconductor layer having a greater electron affinity than that of said second semiconductor layer, and being formed at a surface thereof with an opening, said third semiconductor layer being composed of InP;

(d) source and drain electrodes formed on said third semiconductor layer; and (e) a gate electrode formed on said second semiconductor layer in said opening of said third semiconductor layer, wherein said second semiconductor layer is composed of InAlAs, further comprising a fourth semiconductor layer sandwiched between said second and third semiconductor layers, said fourth semiconductor layer being composed of InAlGaAs.

8. The hetero-junction field effect transistor as set forth in claim 7, wherein said fourth semiconductor layer is composed of $In_{0.52}Al_xGa_{0.48-x}As$, and a composition ratio X of Al is gradually decreasing from said second semiconductor layer to said third semiconductor layer.

9. The hetero-junction field effect transistor as set forth in claim 8, wherein said composition ratio X of Al is decreased from 0.48 to 0.24.

10. A hetero-junction field effect transistor comprising:

(a) a first semiconductor layer composed of InP;

(b) a second semiconductor layer formed on said first semiconductor layer, said second semiconductor layer having a smaller electron affinity than that of said first semiconductor layer;

(c) a third semiconductor layer formed on said second semiconductor layer, said third semiconductor layer having a greater electron affinity than that of said second semiconductor layer, and being formed at a surface thereof with an opening, said third semiconductor layer being composed of InP;

(d) source and drain electrodes formed on said third semiconductor layer; and (e) a gate electrode formed on said second semiconductor layer in said opening of said third semiconductor layer, further comprising a fifth semiconductor layer sandwiched between said third semiconductor layer and said source and drain electrodes, said fifth semiconductor layer being composed of n-type InGaAs.

11. The hetero-junction field effect transistor as set forth in claim 10, wherein said fifth semiconductor layer is composed of n-type $In_YGa_{1-Y}As$ ($0.53 \leq Y \leq 1$).

12. The hetero-junction field effect transistor as set forth in claim 10, further comprising a sixth semiconductor layer sandwiched between third and fifth semiconductor layers, said sixth semiconductor layer being composed of InAlGaAs.

13. The hetero-junction field effect transistor as set forth in claim 12, wherein a composition ratio of Al in said sixth semiconductor layer is gradually decreasing from said third semiconductor layer to said sixth semiconductor layer.

14. The hetero-junction field effect transistor as set forth in claim 4, further comprising:

a seventh semiconductor layer sandwiched between said first and second semiconductor layers, said seventh semiconductor layer comprising undoped InAlAs.

15. A hetero-junction field effect transistor comprising:

(a) a first semiconductor layer composed of InP;

(b) a second semiconductor layer formed on and contiguous to said first semiconductor layer, said second semiconductor layer having a smaller electron affinity than that of said first semiconductor layer;

(c) a third semiconductor layer formed on said second semiconductor layer, said third semiconductor layer having a greater electron affinity than that of said second semiconductor layer, and being formed at a surface thereof with an opening, said third semiconductor layer being composed of InP;

(d) source and drain electrode formed on said third semiconductor layer; and (e) a gate electrode formed on said second semiconductor layer in said opening of said third semiconductor layer, wherein said second semiconductor layer is formed with a recess in alignment with said opening of said third semiconductor layer, and wherein said gate electrode is formed on said second semiconductor layer in said recess.

16. A hetero-junction field effect transistor comprising:

(a) a first semiconductor layer;

(b) a second semiconductor layer formed on and contiguous to said first semiconductor layer, said second semiconductor layer having a smaller electron affinity than that of said first semiconductor layer; and, (c) a third semiconductor layer formed on said second semiconductor layer, said third semiconductor layer having a greater electron affinity than that of said second semiconductor layer, and being formed at a surface thereof with an opening.

wherein the conduction band offset between said first layer and said second layer is approximately equal to the conduction band offset between said second layer and said third layer.

* * * * *